(12) United States Patent
Dixon et al.

(10) Patent No.: US 6,757,617 B2
(45) Date of Patent: Jun. 29, 2004

(54) MULTIPLE FAN MONITORING CIRCUIT FOR MONITORING A NUMBER OF FANS UTILIZING A SINGLE SENSE INPUT

(75) Inventors: Robert Christopher Dixon, Austin, TX (US); Chad J. Larson, Ames, IA (US)

(73) Assignee: International Business Machines Corporation, Armonk, NY (US)

( * ) Notice: Subject to any disclaimer, the term of this patent is extended or adjusted under 35 U.S.C. 154(b) by 195 days.

(21) Appl. No.: 09/768,074

(22) Filed: Jan. 23, 2001

(65) Prior Publication Data

US 2002/0099508 A1 Jul. 25, 2002

(51) Int. Cl.$^7$ .............................................. G05D 23/00
(52) U.S. Cl. ............................ 702/25; 702/34; 702/41; 702/64; 702/65; 702/66; 702/69; 702/70
(58) Field of Search .............................. 702/34, 41, 64, 702/65, 66, 69, 70, FOR 107, FOR 110; 361/676, 683, 687, 695, 688, 697; 318/618, 463, 464, 807, 812, 817, 432; 388/900, 903

(56) References Cited

U.S. PATENT DOCUMENTS

| | | | | |
|---|---|---|---|---|
| 5,604,654 A | * | 2/1997 | Wille et al. ..................... | 361/23 |
| 5,727,928 A | * | 3/1998 | Brown ..................... | 417/44.11 |
| 5,926,386 A | * | 7/1999 | Ott et al. ....................... | 700/70 |
| 5,963,887 A | * | 10/1999 | Giorgio ......................... | 702/64 |
| 6,008,603 A | * | 12/1999 | Jones et al. .................. | 318/254 |
| 6,054,823 A | * | 4/2000 | Collings et al. ............. | 318/439 |
| 6,135,718 A | * | 10/2000 | Yang ............................ | 417/22 |
| 6,163,266 A | * | 12/2000 | Fasullo et al. ............... | 340/664 |
| 6,247,898 B1 | * | 6/2001 | Henderson et al. ............ | 417/3 |
| 6,400,113 B1 | * | 6/2002 | Garcia et al. ................ | 318/463 |
| 6,428,282 B1 | * | 8/2002 | Langley ......................... | 417/2 |
| 6,487,463 B1 | * | 11/2002 | Stepp, III .................... | 700/79 |
| 2002/0088615 A1 | * | 7/2002 | Dixon et al. ................. | 165/287 |
| 2002/0105293 A1 | * | 8/2002 | Harlan ........................ | 318/254 |
| 2002/0133728 A1 | * | 9/2002 | Agarwal ..................... | 713/324 |

FOREIGN PATENT DOCUMENTS

JP           05056178 A   *   3/1993   .......... H04M/11/00

* cited by examiner

*Primary Examiner*—Marc S. Hoff
*Assistant Examiner*—Carol S Tsai
(74) *Attorney, Agent, or Firm*—Mark E. McBurney; Dillon & Yudell LLP

(57) ABSTRACT

A multiple fan monitoring circuit for use with a plurality of fans, wherein each of the fans operates at a different frequency and generates a tach signal indicative of the fan operation, including a number of waveform shaping networks coupled to a corresponding one of the fans and utilized to waveshape a tach signal generated by its corresponding fan. The multiple fan monitoring circuit also includes a frequency processing circuit, coupled to the waveform shaping networks, that receives the waveshaped tach signals at a single sense node. The frequency processing circuit includes a summing circuit, coupled to the single sense node, that combines the waveshaped tach signals into a single combined signal, and a frequency discriminator, coupled to the summing circuit, that separates the single combined signal into multiple components, wherein each of the multiple components corresponds to a particular fan.

18 Claims, 3 Drawing Sheets

MULTIPLE FAN MONITORING CIRCUIT FOR MONITORING A NUMBER OF FANS UTILIZING A SINGLE SENSE INPUT

BACKGROUND OF THE INVENTION

1. Technical Field

The present invention relates in general to cooling systems for electronic systems and, in particular, to the monitoring of the operation of cooling apparatus. More particularly, the present invention relates to a multiple fan monitoring circuit and method of operation thereof for monitoring a number of cooling fans utilizing a single sense input.

2. Description of the Related Art

Integrated circuits and other electrical devices generally have rated operating temperature ranges. Within these operating ranges, the devices behave according to specified requirements. Outside of the rated operating range, the response characteristics of the circuits and devices can vary from the specified requirements. At elevated temperatures, it is known for integrated circuits and other electrical devices to fail or burn out or otherwise become defective. Accordingly, it is desirable to maintain circuits and devices within their rated operating temperature ranges.

In a computer system, continued operation of an electronic device leads to the generation of heat. In some instances, albeit rare, ambient air is sufficient to provide cooling to maintain the circuit or device within the desired operating temperature range. However, some circuits or components generate enough heat to require affirmative cooling from a cooling fan. Typically, computers have included a cooling fan inside the computer housing to prevent overheating caused by the normal operation of the computer. Also, it not uncommon for a computer system, such as a server system, to utilize more than one cooling fan to maintain a specified operating temperature.

Computer systems must monitor their cooling fans to verify that the fans are powered on and rotating at a predetermined speed to maintain a desired thermal condition that precludes accelerated failures of electronic devices utilized in the computer systems. Typically, each cooling fan generates a "feedback" signal that provides information, such as rotational speed. A monitoring processor, typically a system processor, receives this feedback signal at a fan sense pin. As additional fans are added to a system. e.g., to compensate for additional electronic devices due to system upgrades, the number of fans may exceed the number of fan sense pins available for monitoring the fans' status.

Accordingly, what is needed in the art is an improved method for monitoring cooling fans that mitigates the limitations discussed above. More particularly, what is needed in the art is a means for monitoring the operational status of more than one cooling fan utilizing a single sense pin.

SUMMARY OF THE INVENTION

It is therefore an object of the invention to provide an improved data processing system.

It is another object of the invention to provide a multiple fan monitoring circuit for monitoring a plurality of fans utilizing a single sense input.

To achieve the foregoing objects, and in accordance with the invention as embodied and broadly described herein, a multiple fan monitoring circuit for use with a plurality of fans, wherein each of the fans operates at a different frequency and generates a tach signal indicative of the fan operation is disclosed. The multiple fan monitoring circuit includes a number of waveform shaping networks, wherein each of the waveform shaping networks is coupled to a corresponding one of the fans. Each of the waveform shaping circuit is utilized to waveshape a tach signal generated by its corresponding fan. The multiple fan monitoring circuit also includes a frequency processing circuit, coupled to the waveform shaping networks, that receives the waveshaped tach signals at a single sense node. In a related embodiment, the frequency processing circuit includes a summing circuit, coupled to the single sense node, that combines the waveshaped tach signals into a single combined signal. The frequency processing circuit also includes a frequency discriminator, coupled to the summing circuit, that separates the single combined signal into multiple components, wherein each of the multiple components corresponds to a particular fan.

The present invention recognizes that as additional fans are added to a system, the number of fan sense pins available for monitoring fan status and operation becomes a limiting factor. Typically, a system architecture only provides a limited number of fan sense lines. As soon as the number of fans employed in the system exceed the number the number of fan sense lines, the system cannot monitor and ensure that all the fans are operational, e.g., powered on and rotating at the appropriate speed, to maintain a desired thermal condition. The present invention overcomes the problem of limited fan sense lines by disclosing a novel multiple fan monitoring circuit that allows a single sense line to monitor more than one fan.

In another embodiment of the present invention, the frequency processing circuit further includes an analog to digital converter to convert the single combined signal from an analog signal to a digital signal. In an advantageous embodiment, a fast fourier transform (FFT) process is then utilized to separate the single combined signal into multiple components, each of which corresponds to a different fan.

The foregoing description has outlined, rather broadly, preferred and alternative features of the present invention so that those skilled in the art may better understand the detailed description of the invention that follows. Additional features of the invention will be described hereinafter that form the subject matter of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
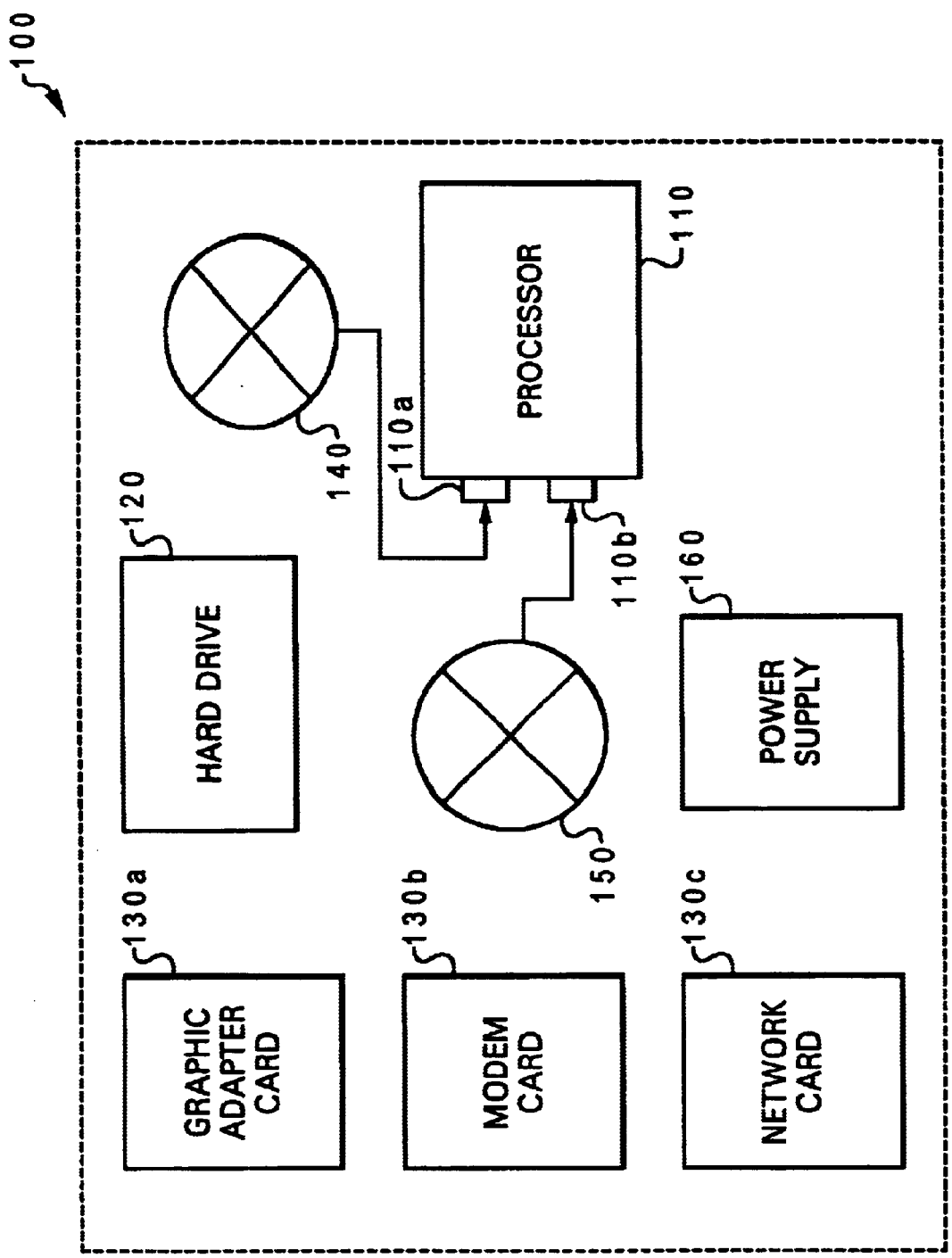
FIG. 1 illustrates an exemplary data processing system that provides a suitable environment for the practice of the present invention.

With reference now to the figures and in particular with reference to FIG. 1, there is depicted an exemplary data processing system 100 that provides a suitable environment for the practice of the present invention. Data processing system 100, such as a personal computer (PC), includes a processor 110, such as a conventional microprocessor, coupled to a number of electronic devices. As shown in the illustrated embodiment, the electronic devices generally include a power supply 160 for providing power, a non-volatile memory device, i.e., hard drive 120, and a plurality of circuit boards, generally designated 130a–130c, such as a graphic adapter card, modem card and network communication card. As discussed previously, these electronic devices generate heat when they are in operation. To dissipate the generated heat and prevent component failures due to elevated temperatures, a first cooling fan 140 is utilized in the illustrated embodiment to provide a means of removing the generated heat from an enclosure (not shown) that houses the electronic devices. Additionally, a second cooling fan 150 is typically employed to prevent a microprocessor from overheating and consequently failing. The operation of first and second fans 140, 150 are monitored by processor 110 via first and second fan sense pins 110a, 110b, respectively. It should be noted that in other conventional data processing systems, the processor employed may only have a single sense pin allocated for monitoring a single cooling fan.

In the event of that additional electronic devices are added to data processing system 100, e.g., firmware upgrades or additional circuit boards, such as sound cards, the overall thermal characteristics of data processing system 100 changes with the increased heat generation. These additions to data processing system 100 may not have considered or envisioned when data processing system's 100 architecture was first designed. The heat generated by the additional "upgrades" may exceed the cooling, or heat dissipation, capacity of first and second fans 140, 150. Typically, to mitigate the additional heat generated by any additional electronic device, first cooling fan 140 may be replaced with a greater cooling capacity fan or a third fan (not shown) may be installed to compensate for the additional heat generated by the additional devices.

The present invention recognizes that as additional fans are added to a system, the number of fan sense pins available for monitoring fan status and operation becomes a limiting factor. Typically, a system architecture only provides a limited number of fan sense lines. As soon as the number of fans employed in the system exceed the number the number of fan sense lines, the system cannot monitor and ensure that all the fans are operational, e.g., powered on and rotating at the appropriate speed, to maintain a desired thermal condition. The present invention overcomes the problem of limited fan sense lines by disclosing a novel multiple fan monitoring circuit that allows a single sense line to monitor more than one fan.

Figure 2:
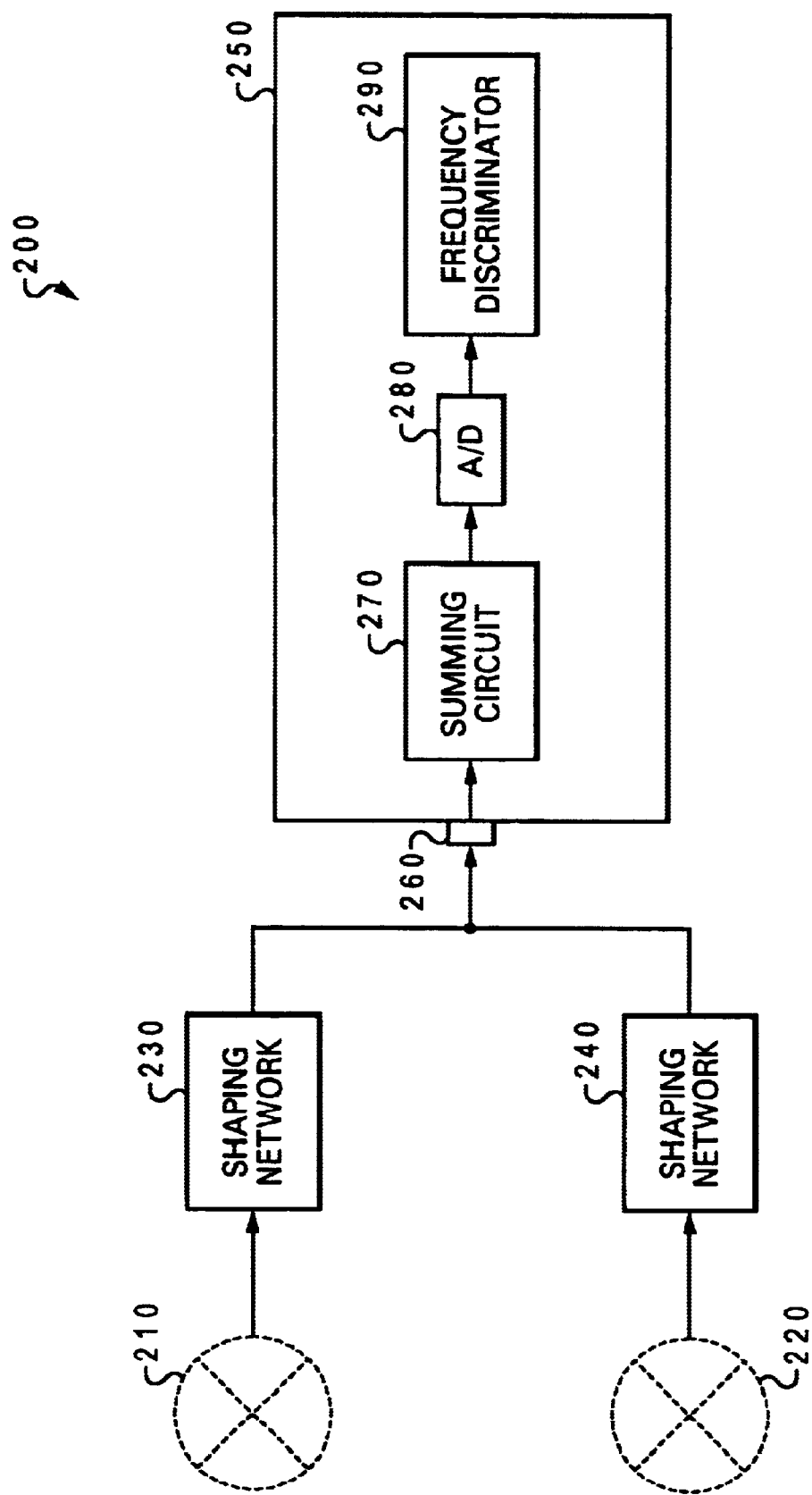
FIG. 2 illustrates a simplified block diagram of an embodiment of a multiple fan monitoring circuit according to the principles disclosed by the present invention.

Referring now to FIG. 2, there is illustrated a simplified block diagram of an embodiment of a multiple fan monitoring circuit 200 according to the principles disclosed by the present invention. In the illustrated embodiment, the operation of first and second fans 210, 220 are monitored utilizing a single fan sense node 260 (analogous to the fan sense pins shown in FIG. 1). Each of first and second fans 210, 220 generates a tach feedback signal, i.e., a pulse train, that is indicative of the fan's operation. The tach signal provides information, such as speed and failure condition, with respect to the fan's operation to a monitoring processor (not shown). The monitoring processor, in turn, utilizes this information to verify the status and operation of the fans. It should be noted that the individual fans, i.e., first and second fans 210, 220, are operating at different frequencies, specifically at frequencies that are not harmonics of each other. This is to preclude any aliasing effects when the signals are later combined and processed in accordance with the present invention.

The multiple fan monitoring circuit 200 includes first and second shaping networks 230, 240 that receives the feedback signals generated by first and second fans 210, 220, respectively, and "waveshape" the substantially square tach feedback signals to produce sinusoidal waveforms and to filter out all the unnecessary high frequency components. First and second shaping networks 230, 240 are coupled to a frequency processing circuit 250 via a fan sense node 260. Frequency processing circuit 250 includes a summing circuit 270 that combines the waveshaped feedback signals into a single combined feedback signal. Adding the two sinusoidal feedback signals results in a composite sense signal that retains all of the information required to monitor the status of first and second fans 210, 220.

Frequency processing circuit 250 also includes an analog to digital converter 280 and a frequency discriminator 290. Analog to digital converter 280 is utilized to convert the analog single combined signal into a digital form. It should be noted that the composite combined signal is somewhat difficult to interpret as illustrated by the trigonometric identity:

$$\sin x + \sin y = 2[\sin(x+y)/2][\cos(x-y)/2]$$

However, the combined signal still retains all the necessary information contained in the original signals. Frequency discriminator 290, such as a Fast Fourier Transform (FFT), can operate on the combined signal to extract the frequency information of first and second fans' 210, 220 feedback signals. It should be noted that the choice of a FFT as a frequency discriminator need not be as computationally costly as it might first appear. Instead of computing the FFT of the combined signal on a continues basis, the computation of the FFT of the combined signal may be accomplished at discrete intervals, e.g., once every minute. In an advantageous embodiment, a sampling rate of 100 Hz is employed. This, in turn, will not require much processor bandwidth while, at the same time, will provide accurate fan status information.

Figure 3:
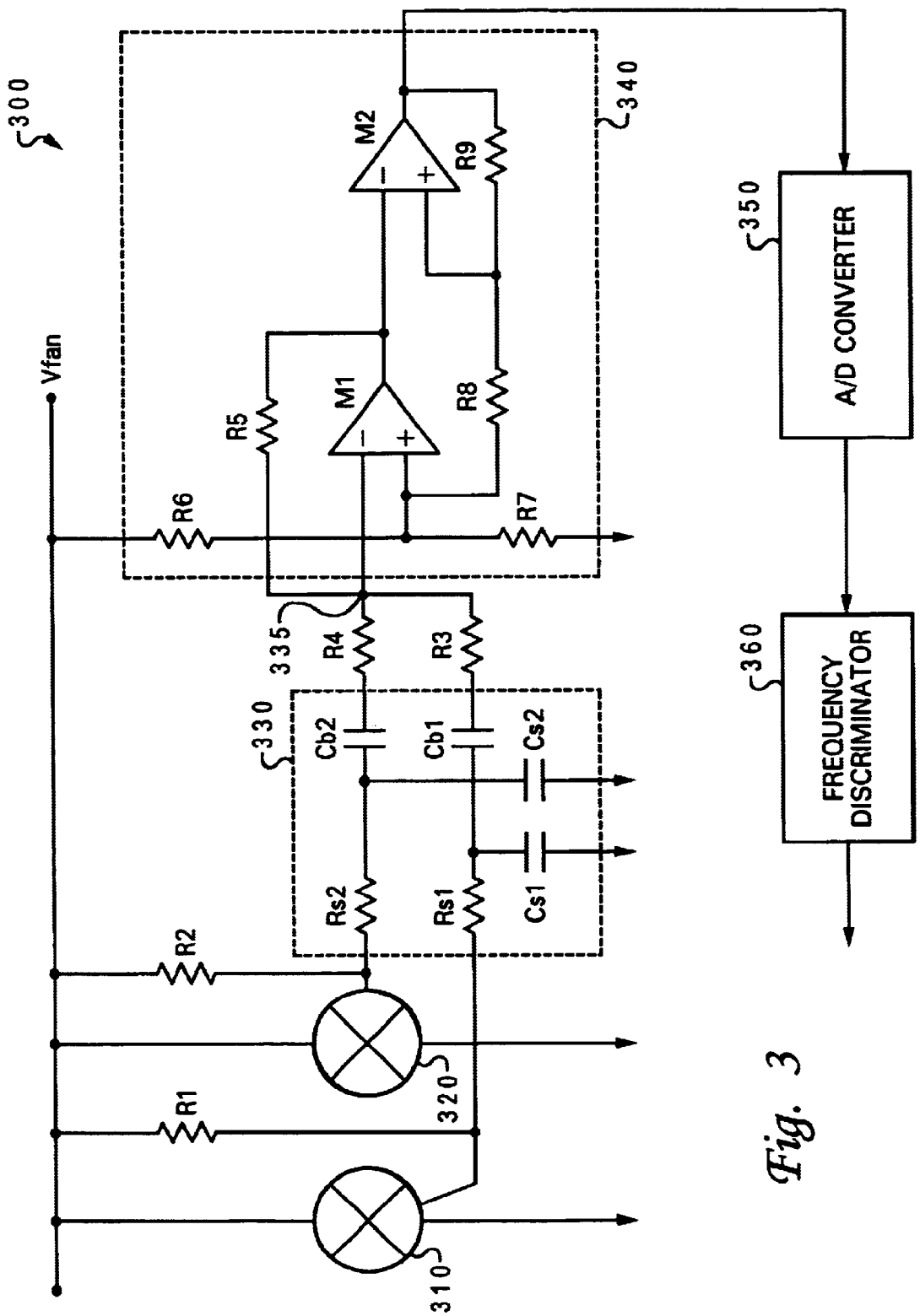
FIG. 3 illustrates a schematic diagram of an embodiment of a multiple fan monitoring circuit in accordance with the present invention.

Referring now to FIG. 3, there is depicted a schematic diagram of an embodiment of a multiple fan monitoring circuit 300 in accordance with the present invention. In the illustrated embodiment, first and second fans 310, 320 generate feedback signals in the form of pulses, i.e., a tach signal, that provide information of the operation of the fans. For example, each pulse may represent a complete rotation and information with respect to fan speed may be extracted based on the number of pulses in a given period of time. This type of information is particularly useful to a monitoring processor so that the speed of the fans may be adjusted to the current thermal conditions of the system employing the fans. A first and second resistances R1, R2 are utilized to couple the feedback signals of first and second fans 310, 320, respectively, to a fan voltage Vfan. First and second fans 310, 320 are coupled to a shaping network 330 (analogous to first and second shaping network 230, 240 in FIG. 2) that includes first and second shaping resistors Rs1, Rs2 and first and second shaping capacitors Cs1, Cs2. As shown in the illustrated embodiment, first shaping resistor Rs1 and first shaping capacitor Cs1 are utilized to "waveshape" first fan's 310 pulse feedback signal into a substantially sinusoidal waveform and filter out high frequency components. Second shaping resistor Rs2 and second shaping capacitor Cs2 perform the same waveshaping and filtering function on second fan's 320 feedback signal.

Shaping network 330 also includes a first and second blocking capacitor Cb1, Cb2 that are utilized to block any DC components of the waveshaped signals. The resulting sinusoidal signals are then provided to a summing circuit 340 via third and fourth resistances R3, R4 at node 335 (analogous to fan sense node 260 in FIG. 2). Summing circuit 340 includes a first and second operational amplifiers M1, M2. In the illustrated embodiment, first operational amplifier M1 is configured as a summer with its inverting input coupled to node 335. A fifth resistance R5 is also utilized in a feedback loop from first operational amplifier M1 output to its inverting input. Summing circuit 340 also includes sixth and seven resistances R6, R7 that couple the noninverting input of first operational amplifier M1 to fan voltage Vfan and ground respectively. The output of first operational amplifier M1 is coupled to the inverting input of second operational amplifier M2. A ninth resistance R9 couples the output of second operational amplifier M2 to its noninverting input, while an eight resistance R8 couples the noninverting inputs of first and second operational amplifiers M1, M2 together.

As discussed previously, the resultant combined analog signal at the output of second operational amplifier M2 is converted by a conventional analog to digital converter 350 to an equivalent digital signal that, in turn, is provided to frequency discriminator 360 for further processing. As discussed previously, frequency discriminator 360 utilizes a FFT operation to decompose the equivalent digital signal into its constituent frequency components where each frequency component represents a fan feedback signal. Frequency discriminator 360 may be implemented utilizing conventional signal processing devices that are well known in the art or, alternatively, in another advantageous embodiment, is implemented utilizing software programs that readily available and well known in the art. The information is provided to and utilized by a service processor (analogous to processor 110 in FIG. 1) to determine the operational status of first and second fans 310, 320. For example, the absence of a signal at a frequency corresponding to, e.g., first fan 310 would indicate that first fan 310 has failed and is not rotating. In this case, the service processor will execute a predetermined error recovery operation that may include displaying a fan failure prompt on an attached display and, in addition, begin shutdown operation of the system to prevent overheating the electronic components in the system. Although the present invention has been described in the context to two fans, those skilled in the art should readily appreciate that the present invention is not limited to monitoring two fans utilizing a single sense input. The multiple fan monitoring circuit 300 may be advantageously utilized with any number of fans with only one limitation as discussed previously. Specifically, fans should not be operate at frequencies that are harmonics of each other to preclude aliasing problems.

While the invention has been particularly shown and described with reference to a preferred embodiment, it will be understood by those skilled in the art that various changes in form and detail may be made therein without departing from the spirit and scope of the invention.

What is claimed is:

1. A multiple fan monitoring circuit for use with a plurality of fans, wherein each of said plurality of fans operates at a different frequency and generates a tach signal indicative of said fan operation that is output on a single fan sense node, wherein each of said tach signals is output concurrently with each of the other said tach signals on said single fan sense node, comprising:

a plurality of waveform shaping networks, wherein each of said plurality of waveform shaping networks is coupled to a corresponding one of said plurality of fans and utilized to waveshape a tech signal generated by said corresponding fan; and a frequency processing circuit, coupled to said plurality of waveform shaping networks, that concurrently receives said waveshaped tach signals at a single fan sense node, wherein said frequency processing circuit includes:

a summing circuit, coupled to said single fan sense node, that combines said waveshaped tach signals into a single combined signal; and a frequency discriminator, coupled to said summing circuit, that separates said single combined signal into multiple components, wherein each of said multiple components corresponds to a particular fan in said plurality of fans.

2. The multiple fan monitoring circuit as recited in claim 1, wherein said frequency processing circuit further comprises an analog to digital converter.

3. The multiple fan monitoring circuit as recited in claim 1, wherein said summing circuit includes a operational amplifier (op-amp) configured as a summer.

4. The multiple fan monitoring circuit as recited in claim 1, wherein each of said plurality of waveform shaping circuits includes a resistor and a capacitor.

5. The multiple fan monitoring circuit as recited in claim 1, wherein said frequency discriminator utilizes a fast fourier transform (FFT) process to separate said single combined signal into multiple components.

6. The multiple fan monitoring circuit as recited in claim 1, wherein each of said plurality waveform shaping networks includes a blocking capacitor.

7. A method for monitoring a plurality of fans utilizing a single sense node, wherein each of Bald plurality of fans operates at a different frequency and generates a tach signal indicative of said fan operation, said method comprising:

waveshaping each of said tach signals generated by said plurality of fans;

combining said waveshaped tach signals at said single sense node into a single combined tach signal; and separating said single combined tach signal into multiple components, wherein each of said multiple components corresponds to an associated fan in said plurality of fans.

8. The method as recited in claim 7, wherein said waveshaping each of said tach signals includes utilizing a plurality of waveform shaping networks, wherein each of said plurality of wave form shaping networks includes a resistor and a capacitor.

9. The method as recited in claim 7, further comprising converting said single combined signal into a digital form.

10. The method as recited in claim 7, wherein said combining said waveshaped tach signals includes utilizing a operational amplifier configured as a summer.

11. The method as recited in claim 7, wherein said separating said single combined signal includes performing a fast fourier transform (FFT) operation on said single combined signal.

12. The method as recited in claim 9, wherein said converting said single combined signal includes utilizing an analog to digital converter.

13. A data processing system, comprising:

a processor having at least one single fan sense node;

a plurality of fans, wherein each of said plurality of fans operates at a different frequency and generates a tach signal indicative of said fan operation that is output on said single fan sense node, wherein each of said tach signals is output concurrently with each of the other said tack signals on said single fan sense node; and a multiple fan monitoring circuit, coupled to said plurality of fans, including:

a plurality of waveform shaping networks, wherein each of said plurality of waveform shaping networks is coupled to a corresponding one of said plurality of fans and utilized to waveshape a tach signal generated by said corresponding fan; and a frequency processing circuit, coupled to said plurality of waveform shaping networks, that receives said waveshaped tech signals at said single fan sense node, wherein said frequency processing circuit includes:

a summing circuit, coupled to said single fan sense node, that combines said waveshaped tach signals at said single fan sense node into a single combined signal; and a frequency discriminator, coupled to said summing circuit, that separates said single combined signal into multiple components, wherein each of said multiple components corresponds to a particular fan in said plurality of fans.

14. The data processing system as recited in claim 13, wherein said frequency processing circuit further comprises an analog to digital converter.

15. The data processing system as recited in claim 13, wherein said summing circuit includes a operational amplifier (op-amp) configured as a summer.

16. The data processing system as recited in claim 13, wherein each of said plurality of waveform shaping circuits includes a resistor and a capacitor.

17. The data processing system as recited in claim 13, wherein said frequency discriminator utilizes a fast fourier transform (FFT) process to separate said single combined signal into multiple components.

18. The data processing system as recited in claim 13, wherein each of said plurality waveform shaping networks includes a blocking capacitor.

* * * * *

UNITED STATES PATENT AND TRADEMARK OFFICE
CERTIFICATE OF CORRECTION

PATENT NO. : 6,757,617 B2 Page 1 of 1
APPLICATION NO. : 09/768074
DATED : June 29, 2004
INVENTOR(S) : Dixon et al.

It is certified that error appears in the above-identified patent and that said Letters Patent is hereby corrected as shown below:

On the title page, at (*) Notice: please replace the paragraph with the following:

--Subject to any disclaimer, the term of this patent is extended or adjusted under 35 U.S.C. 154(b) by 250 days.--

Signed and Sealed this

Third Day of April, 2007

JON W. DUDAS
*Director of the United States Patent and Trademark Office*